United States Patent

Redington

[15] 3,698,078

[45] Oct. 17, 1972

[54] DIODE ARRAY STORAGE SYSTEM HAVING A SELF-REGISTERED TARGET AND METHOD OF FORMING

[72] Inventor: Rowland W. Redington, Schenectady, N.Y.

[73] Assignee: General Electric Company

[22] Filed: Dec. 22, 1969

[21] Appl. No.: 886,951

[52] U.S. Cl. ....................29/578, 340/173, 156/17, 29/576

[51] Int. Cl. ....................B01j 17/00, H01l 5/00

[58] Field of Search ....................29/571, 578, 576 B

[56] References Cited

UNITED STATES PATENTS

| | | | |
|---|---|---|---|
| 3,481,030 | 12/1969 | TeVelde et al. | 29/571 |
| 3,470,609 | 10/1969 | Breitweiser | 29/571 |
| 3,519,504 | 7/1970 | Cuomo | 148/187 |
| 3,566,517 | 3/1971 | Brown et al | 29/578 X |

*Primary Examiner*—John F. Campbell
*Assistant Examiner*—W. Tupman
*Attorney*—Richard R. Brainard, Paul A. Frank, John J. Kissane, Frank L. Neuhauser, Oscar B. Waddell and Joseph B. Forman

[57] ABSTRACT

A self-registered diode array camera tube target is formed utilizing a refractory metal grid as a mask both during etching of the insulating layer protecting the semiconductive substrate from electron beam irradiation and during diffusion of the monolithic diode array into the substrate. The refractory metal grid thus completely overlies the insulating layer between adjacent diodes of the target and, upon the application of a suitable electrical bias to the grid, the landing characteristics of the electron beam upon the target is controlled to inhibit charging of the insulating layer by the scanning beam. A dual grid camera tube target also is disclosed wherein the outermost grid controls the electron beam landing profile while a more positively biased inner grid remote from the electron beam negates the generation of conductivity producing charge carriers at the substrate-insulating layer interface.

3 Claims, 5 Drawing Figures

Figure 1:
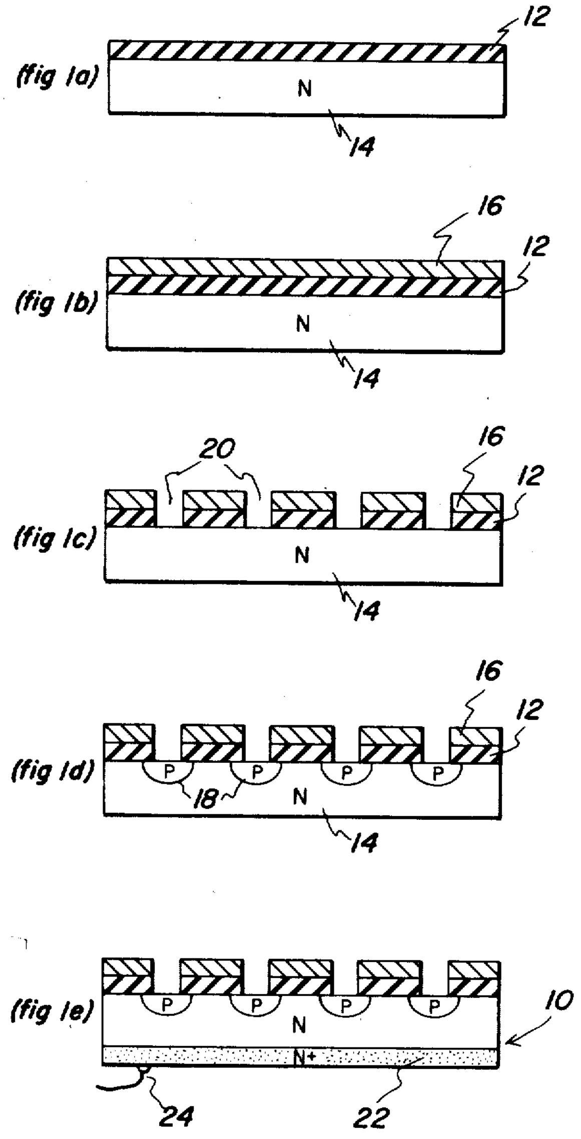

INVENTOR:
ROWLAND W. REDINGTON,
by John J. Kessane
HIS ATTORNEY

INVENTOR:
ROWLAND W. REDINGTON,
by John J. Kissane
HIS ATTORNEY

DIODE ARRAY STORAGE SYSTEM HAVING A SELF-REGISTERED TARGET AND METHOD OF FORMING

This invention relates to an electron beam storage system having a self-registered diode array target and to a method of forming such targets. In a more particular aspect, the invention relates to a diode array storage system wherein the diffusion mask employed to form a self-registered diode array target is utilized as a biasing grid to control beam landing characteristics during scanning of the diode array target.

Diode array storage systems during operation characteristically scan an electron beam across a target having an array of p-type dots along an n-type semiconductive wafer to reverse bias the diodes formed at each dot-wafer junction whereupon light rays subsequently impinging upon the opposite face of the target produce hole-electron pairs selectively discharging the diodes. Measurement of charge required to reverse bias the diodes during a successive scan of the target indicates the spacial distribution of light impinging upon the target permitting a visual display of the impinging light image.

Desirably, the electron beam employed to scan the target is of a diameter to reverse bias a plurality of adjacent diodes simultaneously to minimize by redundancy pictorial modulation produced by the discrete nature of the array. As the large diameter scanning electron beam, however, traverses the insulating shield overlying the n-type region of the wafer, electron beam induced charge is formed in the insulating shield tending to form a short circuit channel between adjacent diodes of the target. With very low leakage insulators, such as silicon dioxide, the electron beam deposited charge on the insulating shield also can build up so that it can prevent the beam from landing on the p-type dots. To overcome these problems, it has heretofore been proposed that metallic platelets be deposited over both the p-type dots and a portion of the adjacent insulating shield to permit electron beam induced charge to drain from the insulating shield to the p-type dots. Because of the stringent registration techniques required for depositing the platelets to inhibit shorting between adjacent platelets while masking a major portion of the insulating shield, it also has been proposed that a conductive-insulator be deposited over the entire surface of the target to drain charge from the insulating layer.

Suggestions also have been advanced that a metallic mesh intermediate conductive platelets be utilized to apply bias to the immediately underlying insulating shield to inhibit the attraction of positively charged holes to the insulating shield-wafer interface. The proposed grid structure however, customarily does not cover the entire insulating layer and highly stringent registration techniques are required for the multiprocessing steps required in forming the structure. Similarly, proposals for biasing the conductive-insulator generally requires etching of the conductive-insulator from the p-regions of the target negating the main advantage, i.e., freedom from precise registration etching, associated with utilization of the conductive-insulator layer.

It is, therefore, the object of this invention to provide an automatic registration technique for forming a diode array target with an overlying grid structure.

It is also an objective of this invention to provide a method of forming a diode array target wherein the diffusion mask serves as a grid to control beam landing characteristics during subsequent operation of the target.

It is also an object of this invention to provide a diode array storage system having a plurality of self-registered electrodes for inhibiting charge build-up at the insulator-semiconductor interface.

It is still further the object of this invention to provide a diode array storage system exhibiting superior isolation between adjacent diodes.

These and other objects of this invention generally are achieved by utilization of a refractory metal shield both for formation of the monolithic diode array of the target and as a grid electrode to control the electron beam landing characteristics upon the target. Thus, a camera tube target is formed in accordance with the invention by initially forming an insulating coating atop of one face of a semiconductor wafer of first conductivity type and subsequently depositing thereon a film of a refractory metal non-reactive with the underlying insulating coating at activator diffusion temperatures. The metallic film then is selectively etched to form an array of apertures passing therethrough and the exposed underlying insulating coating is etched through the mask formed by the apertured metallic film whereupon an activator impurity of second conductivity type is deposited through the array of apertures to form a p-n junction at each aperture in registration with the overlying metallic film. Electrical contact then is made to the apertured metallic film to permit application of an electrical bias to the film during subsequent operation of the target in a diode array storage system. While refractory metal films heretofore had been proposed (e.g. in Brown et al. continuation-in-part U.S. Pat. application No. 761,389, filed Aug. 16, 1968 and assigned to the present assignee) as diffusion masks for fabricating field effect transistors with the mask subsequently serving as a gate electrode to control current flow in the underlying channel, the advantages of utilizating refractory metal masks during the fabrication of diode array targets to permit improved control of the electron beam landing characteristics during reverse biasing of the target diodes heretofore had not been recognized.

The novel structural combination of this invention therefore includes a target having an array of first conductivity type regions disposed along one face of a semiconductor wafer of second conductivity type to form a plurality of p-n junctions with the wafer and means for scanning the wafer face with an electron source of a diameter to reverse bias at least two adjacent p-n junctions simultaneously. To inhibit shorting of the target by electron beam impingement upon the first conductivity region of the wafer, insulating coating means are provided overlying the first conductivity surface area of the one face of the wafer and suitably biased grid means of a refractory metal non-reactive with the underlying insulating coating at activator diffusion temperatures completely overlies the insulating coating to inhibit the electron beam impingement thereon.

Figure 2:
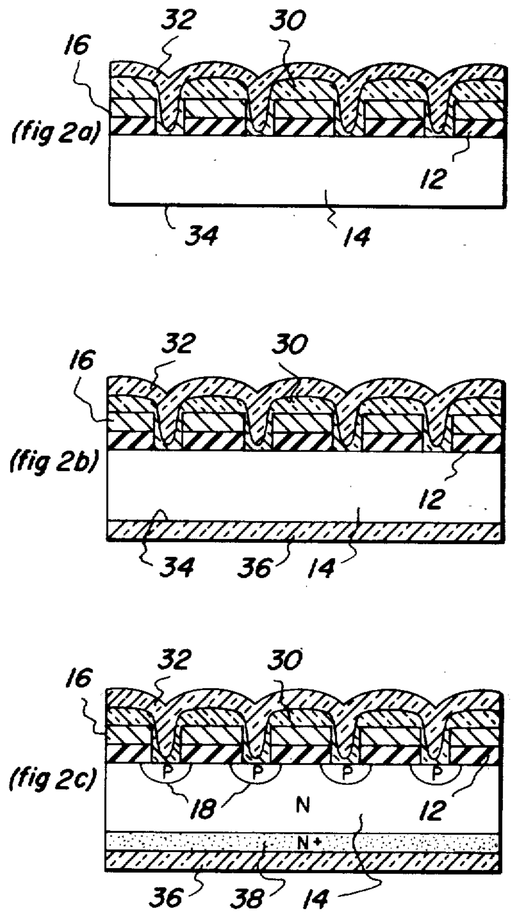
Figure 3:
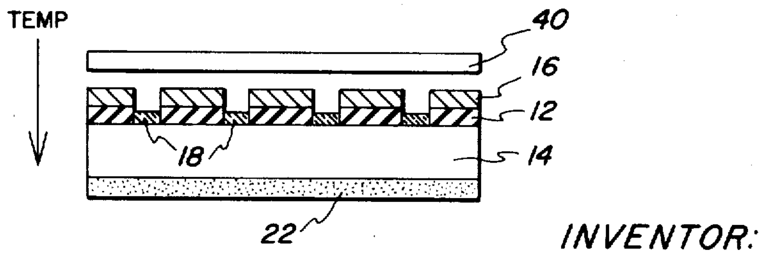
Figure 4:
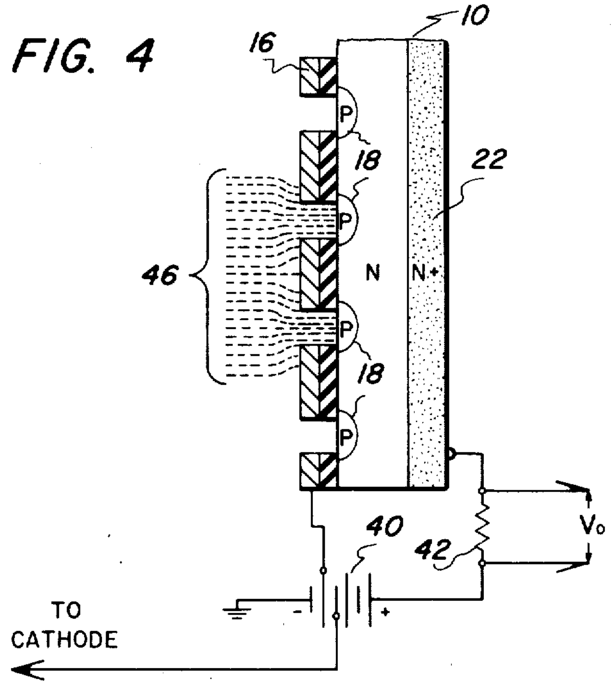
Figure 5:
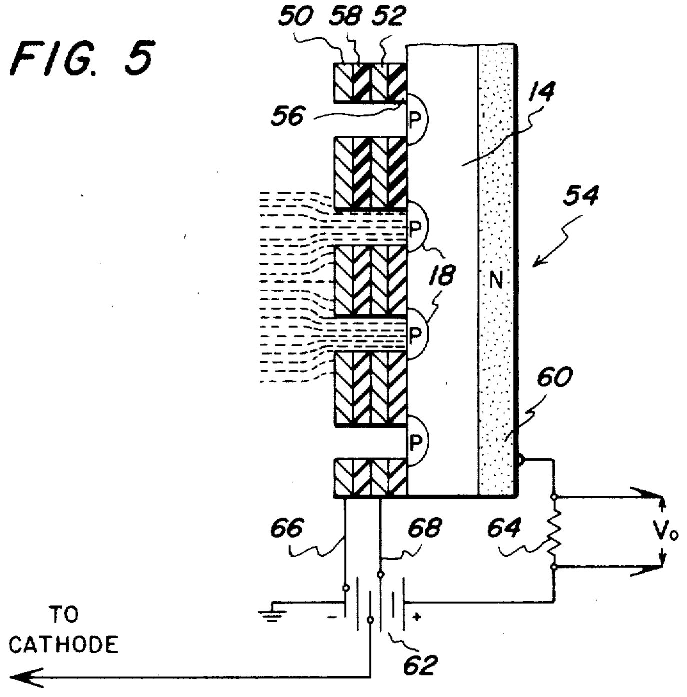

The novel features believed characteristic of the present invention are set forth in the appended claims. The invention itself, together with further objects and the advantages thereof, may best be understood by the reference to the following detailed description taken into conjunction with the appended drawings in which:

FIG. 1 is a flow chart illustrating in sectional view the novel technique for forming the diode array target of this invention, FIG. 2 is a flow diagram illustrating in sectional view a preferred technique for forming a diode array target in accordance with this invention, FIG. 3 is a sectional view illustrating a second preferred technique for forming a diode array target in accordance with this invention, FIG. 4 is a simplified sectional view of a diode array storage system during operation and, FIG. 5 is a sectional view of an alternate diode array target formed in accordance with this invention.

The fabrication of a self-registered diode array target 10 in accordance with this invention is illustrated in FIG. 1 and initially comprises the formation of an electrically insulating layer xx 12 to a thickness between 1,000 and 10,000 A atop a semiconductive wafer 14, as illustrated in FIG. 1A. The semiconductive wafer typically may be, for example, a mono-crystalline silicon wafer having an n-type conductivity of approximately 10 ohm centimeters although a germanium semiconductive wafer advantageously can be employed when the target is designed to detect impinging radiation near the 1.5 micron range.

Insulating layer 12 preferably is an oxide of silicon semiconductor wafer 14 to minimize the number of interface states between the wafer and overlying insulating layer and suitably may be formed by RF sputter deposition of silicon dioxide in a conventional RF sputtering chamber at a pressure of approximately $10^{-3}$ torr argon. Wafer 14 generally is unheated during the RF sputter deposition and sputtering is continued until an insulating layer typically the order of 6000 A is formed atop the wafer. Thinner insulating layers, e.g. to 1000 A, can be employed to increase the dynamic range observable by the target although the delay period for erasure of observed images also is increased by the thinner insulating layers.

Silicon dioxide insulating layers also can be formed by other techniques such as thermal oxidation of wafer 14 at a temperature in excess of 1000° C in a flowing oxygen atmosphere to grow between 40 and 60 percent of the insulating layer thickness with the remainder of the layer being grown by pyrolitic deposition techniques, e.g., heating the wafer to 800° C in an atmosphere of argon previously bubbled through a bath of tetraethylorthosilicate, to minimize the possibility of pin holes in the silicon dioxide insulating layer when the oxide layer is formed only by thermal oxidation. In general, wet oxygen, e.g., an oxygen atmosphere containing in excess of 50 percent humidity at room temperature, is preferred during thermal oxidation because of the more positive charge built into oxide insulating layers formed by wet oxygen relative to layers formed utilizing a dry oxygen atmosphere.

It also often is desirable to employ at least a layer of a second insulator, e.g., silicon nitride, in juxtaposition with the silicon dioxide. In such instances, the silicon dioxide layer generally is relatively thin, i.e., less than 1000 A and typically in the order of 100 A, with the remainder of the insulating layer being formed of silicon nitride suitably by reacting $SiH_4$ and $NH_3$ at a temperature of 1000° C at the surface of the uncoated or oxide coated silicon wafer. Conventionally, the silicon nitride deposition process can employ a partial pressure of 0.15 torr $SiH_4$ in one atmosphere of ammonia and a 6000 A thick film of silicon nitride is formed in approximately 60 minutes.

Alternately, an amorphous film containing silicon, oxygen and nitrogen (generally referred to as silicon oxynitride) may be utilized to form insulating layer 12, e.g. by pyroliticly decomposing a silane, oxygen and ammonia at the surface of a silicon wafer maintained at a temperature of approximately 1000° C to 1200° C.

After formation of insulating layer 12, a thin metallic film 16 of molybdenum, tungsten, tantalum, niobium, platinum, iridium, rhodium, vanadium or other refractory conductive material which is non-reactive with the adjacent insulating film at activator-diffusion temperatures, i.e. temperatures customarily between 900° C and 1400° C, is formed on the surface of the insulating layer as illustrated in FIG. 1B. Typically, the refractory metal film is formed by conventional triode sputtering of the chosen source (hereinafter referred to as molybdenum for convenience purposes) in an approximately $5 \times 10^{-3}$ torr argon atmosphere utilizing a 1500 volt D.C. potential to deposit the molybdenum film to a thickness between 700–10,000 A atop of the insulating layer with sputtering for 15 minutes producing a 4000 A thick molybdenum film preferred for the practice for this invention. If desired, other refractory metal film forming techniques, such as electron beam vacuum evaporation or pyrolytic deposition, also may be employed to form molybdenum film 16.

After formation of film 16, the film is etched utilizing conventional photolithographic techniques to produce an array of apertures 20 having a diameter approximately one-half the center-to-center span between apertures as portrayed in FIG. 1C. The etching suitably is performed by coating film 16 with a layer of any commercially available photoresist which photoresist is selectively irradiated through a mask permitting selective removal of the photoresist by washing the coated structure in a commercially available photoresist developer. The wafer then is heated, for example, at a temperature of approximately 150° C for 40 minutes, to harden the photoresist in preparation for the etching of the underlying film whereupon the structure is immersed in any known molybdenum etch, such as a fericyanide etch comprising 92 grams potassium ferricyanide, 20 grams potassium hydroxide and 300 grams water, to etch the exposed molybdenum film at a rate of approximately 900 A per minute. In general, 7–8 micron apertures on 15 micron centers have been found quite suitable for forming silicon diode array targets. Desirably the aperture dimension is determined relative to the size of the electron beam employed with the diode array camera tube to assure a plurality of adjacent diodes are simultaneously discharged during scanning of the target.

The portion of insulating layer 12 exposed by the aperturing of molybdenum film then is removed by RF sputter etching utilizing the apertured molybdenum film as a mask or by immersing the structure in a suitable etchant, e.g., a "buffered" HF solution containing one part concentrated HF in ten parts of a 40 percent solution of $NH_4F$ for silicon dioxide or silicon oxynitride films. When silicon nitride is employed as insulating layer 12, a concentrated (48 percent by volume) hydrochloric acid etchant or an 85 percent solution of phosphoric acid at 180° C may be employed to selectively remove the exposed insulating layer. After etching of insulating layer 12, the photoresist is removed by scrubbing in a suitable solvent such as trichloroethylene.

An array of p-type conductivity regions 18, illustrated in FIG. 1D, then are diffused into the silicon wafer through the apertures by any suitable technique, for example, gaseous diffusion wherein wafer 14 is heated to a temperature of approximately 1200° C in a 95 percent nitrogen, 5 percent hydrogen atmosphere saturated at room temperature with borontrichloride and water. Apertured film 16 serves as a mask during diffusion to inhibit contamination of underlying insulating layer 12 while diffusion of the boron through apertures 20 produces an automatic registration of p-type conductivity regions 18 with overlying apertured film 16. Wafer 14 then is thinned to approximately 10–20 microns at the center of the diode array and an $n^+$ region 22 is formed on the wafer face remote from regions 18, as illustrated in FIG. 1E, suitably by diffusing phosphorus therein at a temperature of approximately 925° C from a nitrogen stream containing phosphorus tribromide and a trace of oxygen. After formation of $n^+$ region 22, ohmic contact 24 is made to the region utilizing conventional techniques, e.g. employing a vacuum evaporated metal such as gold.

Although p-type conductivity regions 18 can be formed by gaseous diffusion of boron into wafer 14 utilizing apertured film 16 as a diffusion mask, a particularly preferred method of forming the array of p-type conductivity regions is illustrated in FIG. 2 and generally comprises the sequential deposition of an acceptor doped glass layer 30 and an undoped glass layer 32 atop apertured molybdenum film 16 as illustrated in FIG. 2A. Typically, acceptor doped glass layer 30 may be a boron doped glass deposited by pyrolytic deposition, e.g., by passing an argon gaseous stream 100 percent saturated with tetraethylsilicate and a minor quantity of triethylborate across the wafer heated to approximately 800° C. The gaseous stream suitably may be formed by bubbling dry argon through tetraethylsilicate and triethylborate baths in a volume ratio of approximately 10–1 before combining the flow streams for passage over the heated wafer. After the formation of boron doped glass layer 30, the argon is bypassed from the triethylborate bath and undoped glass layer 32 is formed atop layer 30. The structure then is turned to expose face 34 and a donor doped glass layer 36, illustrated in FIG. 2B, is deposited atop the exposed face by conventional pyrolytic techniques, e.g., pyrolysis of ethylorthosilicate and triethylphosphate in a 10–1 ratio utilizing a nitrogen carrier gas and a wafer at approximately 800° C. The glass coated wafer then is heated in a reaction chamber at a temperature typically of 1100° C for about 10–15 hours to cause the boron in glass layer 30 to penetrate into wafer 14 thereby forming p-type conductivity regions 18, illustrated in FIG. 2C, while the phosphorus in glass layer 36 simultaneously is diffused into the opposite face of the wafer to form $n^+$ region 38. The structure then is dipped in a suitable etchant, such as hydrofluoric acid, to remove any glass or impurity layer tending to form on the surface of the wafer. Because the glass layers in juxtaposition with wafer 14 tend to getter any impurities therein during diffusion, the fabrication technique of FIG. 2 generally produces a higher purity target than targets having diodes produced by gaseous diffusion.

Another preferred technique for forming the p-type regions of the diode array target is illustrated in FIG. 3 and generally comprises the epitaxial growth of the p-type regions atop the silicon wafer suitably utilizing an iodine vapor transport. For epitaxial growth, the face of semiconductive wafer 14 shielded by apertured metallic film 16 is placed in close juxtaposition with a p-type doped silicon wafer 40 and a temperature gradient of approximately 100° C is maintained between the wafers, e.g., wafer 40 is maintained at a temperature of approximately 1000° C while wafer 14 is maintained at 1100° C. With an iodine vapor pressure of approximately one millimeter, the p-type doped silicon from wafer 40 is transported to wafer 14 and an array of p-type regions 18 is grown epitaxially atop the exposed surface of wafer 12 to a thickness slightly less than the thickness of insulating layer 12 to inhibit shorting of adjacent p-type regions by the overlying metallic film 16. The wafer then is heated to drive a portion of the p-type impurities into wafer 14 to a depth of approximately 1 micron to complete formation of the diode array target. This method for epitaxially growing p-type conductivity regions of a diode array structure is more fully described and claimed in copending U.S. Pat. application No. 845,435, filed July 28, 1969 in the name of W. E. Engeler and assigned to the assignee of the present invention.

Because molybdenum film 16 serves as a diffusion shield during formation of p-type conductivity regions 18 in semiconductive wafer 14, the regions are automatically registered with the molybdenum film which film subsequently serves as an electron beam controlling grid (as will be more fully explained hereinafter). Thus, automatic registration is obtained inherently utilizing the target fabrication technique of this invention and the difficult registration problem heretofore required to form a conductive structure atop an array of diodes is eliminated.

During operation as a diode array storage system, wafer 14 is biased by source 40 through load resistor 42 to a positive potential, e.g. 5–20 volts, relative to the cathode forming electron beam 46 which is traversed across the diode array structure of target 10 as illustrated in FIG. 4. A suitable bias between approximately − 1 volt and + 3 volts relative to the cathode is applied to apertured molybdenum mask 16 to control the electron beam trajectory by diversion of the beam trafectory from the relatively negative metallic grid to the more positive p-type regions 18 of the target. Thus, the number of electrons impinging upon the p-type conductivity regions of the target is increased for a fixed intensity beam and build-up of charge on insulating layer 12 is inhibited by diversion of the electron beam therefrom. In general, film 16 should be near cathode potential to inhibit attraction of electrons to the metal structure while being of insufficient negative potential relative to the cathode to completely block the electron beam from the relatively small diameter p-type regions of the target.

For readout of images impinging upon target 10, electron beam 46 is traversed across a plurality of p-type conductivity regions 18 simultaneously to reverse bias the p-n junctions formed between the irradiated regions and the semiconductor wafer, and the junctions remain substantially in a reversed biased condition unless photons impinging on the $n^+$ face of the target produce electron-hole pairs tending to the discharge the adjacent p-n junctions. Upon subsequent traversal of regions 18 by the electron beam, a current is produced across resistor 42 indicative of the charge required to reverse bias each region and the spacial distribution of the light across the back face of the target.

Superior beam landing control and blockage of charge buildup at the interface between wafer 14 and the immediately overlying insulating layer is achieved utilizing the structure of FIG. 5 wherein dual molybdenum grids 50 and 52 cooperatively function to inhibit shorting between adjacent diodes of target 54. In forming the structure of FIG. 5, an approximately 4000 A silicon dioxide layer 56 is formed by thermal oxidation of wafer 14 and pyrolytic deposition of a silicon dioxide layer thereon whereupon a molybdenum film is deposited completely atop layer 56, e.g., by sputter deposition of a molybdenum source in a 1 micron argon atmosphere. A second silicon dioxide film 58 then is RF sputter deposited atop the molybdenum film and a second molybdenum film is deposited over silicon dioxide film 58. After the outermost molybdenum film is coated with a layer of photoresist and photolithically etched in conventional fashion, the exposed portion of the underlying molybdenum film is etched in a solvent such as the heretofore described ferricyanide etch to form molybdenum grid 50. Molybdenum grid 50 then serves as a mask for the etching of silicon dioxide film 58, e.g., in a "buffered" HF solution, to selectively expose the underlying molybdenum film whereupon the structure is again immersed within the ferricyanide etch to form molybdenum grid 52. The photoresist coating atop molybdenum grid 50 can now be removed from grid 50 and the structure is immersed within the "buffered" HF solution to expose the surface of silicon wafer 14 permitting the subsequent gaseous diffusion of an acceptor impurity into the wafer utilizing the molybdenum grid as a shield to form p-type conductivity regions 18 within the wafer. After the formation of $n^+$ region 60 by diffusion of a donor impurity into the wafer face from a source, such as phosphorus tribromide carried by a nitrogen stream containing a trace of oxygen with the substrate at a temperature in excess of 1000 °C, ohmic contact is made to the $n^+$region and the substrate is biased by source 62 through resistor 64 to a potential approximately 5 –20 volts positive relative to the electron beam generating cathode while a bias between −1 volt and +4 volts with respect to the cathode is applied to outermost molybdenum grid 50 through lead 66 to divert impinging electrons from the grid to the more positive p-type regions 18 of the wafer. A voltage between xx +4 and +10 volts positive relative to the cathode potential then is applied to inner molybdenum grid 52 through lead 68 to decrease the surface generated dark current and to repel charge buildup at the interface between underlying silicon dioxide layer 56 and silicon wafer 14. Thus, by use of dual biasing grids, a high positive potential can be applied to the silicon dioxide-silicon wafer interface to decrease the surface generated dark current without adversely affecting beam landing characteristics controlled by the separately biased outermost molybdenum film 50.

While regions 18 have been described in FIG. 5 as being formed by diffusion of a suitable p-type conductivity inducing dopant into wafer 14, the regions advantageously may be formed by epitaxial growth (utilizing techniques described with reference to FIG. 3) to permit earlier interception of the beam by the regions. The epitaxial growth of the regions should be terminated before reaching grid 52 to inhibit shorting of the target by the grid.

What I claim as new and desire to secure by Letters Patent of the United States is:

1. A method of forming a diode array camera tube target comprising forming a first insulating coating atop one face of a first conductivity type semiconductive wafer, overlying said first insulating coating with a first metallic film of a refractory metal non-reactive with the underlying insulating coating at activator diffusion temperatures, sequentially depositing a second insulating coating and second metallic film atop said first metallic film, selectively etching said second metallic film, said second insulating coating, said first metallic film and first insulating coating to form a plurality of self-registered apertures, depositing an activator impurity of second conductivity type through said array of apertures to form a p-n junction with said first conductivity wafer at each aperture, and forming electrical contact to said apertured metallic films to permit application of electrical bias thereto.

2. A method of forming a diode array camera tube target according to claim 1 wherein said metallic films are selected from the group consisting of molybdenum, tungsten, platinum and tantalum.

3. A method of forming a diode array camera tube target according to claim 1 wherein at least one of said insulating coating is formed as a laminar structure by thermal oxidation of the wafer and subsequent deposition of an insulating layer thereon.

* * * * *